(12) United States Patent
Asakura

(10) Patent No.: US 8,561,676 B2
(45) Date of Patent: Oct. 22, 2013

(54) COOLER USING COOLING MEDIUM

(75) Inventor: Ken Asakura, Toyota (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 788 days.

(21) Appl. No.: 12/669,317

(22) PCT Filed: Aug. 6, 2008

(86) PCT No.: PCT/JP2008/064504
§ 371 (c)(1),
(2), (4) Date: Jan. 15, 2010

(87) PCT Pub. No.: WO2009/022700
PCT Pub. Date: Feb. 19, 2009

(65) Prior Publication Data
US 2010/0206517 A1   Aug. 19, 2010

(30) Foreign Application Priority Data
Aug. 14, 2007   (JP) ................................. 2007-211516

(51) Int. Cl.
*F28F 27/00*   (2006.01)
(52) U.S. Cl.
USPC ....................... 165/134.1; 165/80.4
(58) Field of Classification Search
USPC .................... 165/67, 81, 134.1, 148
See application file for complete search history.

(56) References Cited

U.S. PATENT DOCUMENTS

2005/0189100 A1* 9/2005 Kawahara et al. ............. 165/202
2007/0251669 A1* 11/2007 Hamida et al. .................. 165/67

FOREIGN PATENT DOCUMENTS

| JP | A-11-94489 | 4/1999 |
| JP | A-2001-97052 | 4/2001 |
| JP | A-2006-82570 | 3/2006 |
| JP | A-2008-126739 | 6/2008 |

OTHER PUBLICATIONS

International Preliminary Report on Patentability mailed on Sep. 16, 2008 in corresponding International Application No. PCT/JP2008/064504 (with translation).
International Search Report mailed on Sep. 16, 2008 in corresponding International Application No. PCT/JP2008/064504.

* cited by examiner

*Primary Examiner* — Teresa Walberg
(74) *Attorney, Agent, or Firm* — Oliff & Berridge, PLC

(57) ABSTRACT

A cooler (20) arranged in a PCU (12) is provided with a bottom plate (22), a top plate (28) and a shell (30) arranged between the bottom plate and the top plate. The shell (30) is provided with an inflow side pipe (32) and an outflow side pipe (34) for making a cooling medium flow inside. The bottom plate (22) is provided with fixing holes (36, 38) for fixing the cooler (20) at a suitable position in the PCU (12). Between the fixing hole (38) and the outflow side pipe (34), a notched section (42) is arranged on the bottom plate (22) to partially reduce rigidity so that the shell (30) does not break when an impulsive power is applied to the cooler (20). A notched section (40) may be arranged between the part where the fixing hole (36) is arranged and the inflow side pipe (32).

2 Claims, 6 Drawing Sheets

COOLER USING COOLING MEDIUM

TECHNICAL FIELD

The present invention relates to a cooler using a cooling medium and, more particularly, to a cooler configured to cool a heat-generating member using a cooling medium.

BACKGROUND ART

In a vehicle having a dynamo-electric machine mounted thereon, a Power Control Unit (PCU) for electric devices such as the dynamo-electric machine, a storage device, and so on is provided. Since the PCU includes an inverter circuit being activated at high voltage and high power and performing power conversion, a cooler configured to circulate a cooling medium and extract heat is used for cooling the same. Since the PCU is mounted on the vehicle, the effect of impact in the event of collision needs to be taken into consideration.

For example, Patent Document 1 discloses a cooling flow path block of the PCU in an electric vehicle that includes a fin and hence is high in rigidity, whereby an impact-absorbing effect upon collision of the vehicle may be reduced. Therefore, there is disclosed a configuration in which the cooling flow path block is divided into two parts, which are connected with a joint member having low rigidity. With this configuration, the impact upon collision of the vehicle can be received effectively by an essentially crushable zone.

Patent Document 2 discloses a mounting configuration of auxiliary components for a vehicle, where an inverter is arranged in front of a suspension tower having high rigidity obliquely in plan view and supporting the inverter with a locking rod. It is described therein that when the impact is applied, the inverter is prevented from moving rearward and is rotated in the direction of the vehicle width in the direction along a toe board, which is a partitioning portion with respect to a vehicle cabin, by being guided by the suspension tower, whereby application of an impact on the toe board can be avoided.

Patent Document 1: JP-A-2006-82570
Patent Document 2: JP-A-2001-97052

DISCLOSURE OF INVENTION

Problems to be Solved by the Invention

In the related art, when an external force such as an impact is exerted on an introduction portion which introduces a cooling medium to a cooler; that is, on a cooling medium supply portion, or a driving portion which drives the cooling medium from the cooler; that is, on a cooling medium discharge portion, there is a risk of leakage of the cooling medium from the cooler.

An object of the present invention is to provide a cooler using a cooling medium in which leakage of the cooling medium is restrained even when an external force caused by an impact or the like is exerted on an introduction portion or a discharge portion for the cooling medium.

Means for Solving the Problems

A cooler using a cooling medium according to the present invention is a cooler configured to cool a heat-generating member including: a shell configured to introduce a cooling medium from a cooling medium introduction portion and discharge the cooling medium from a cooling medium discharge portion; and a preferentially deformed portion formed on the shell in the vicinity of at least one of the cooling medium introduction portion and the cooling medium discharge portion and configured to deform preferentially in comparison with other portions upon receipt of an external force.

The cooler using the cooling medium according to the present invention is a cooler configured to cool heat-generating member including: a shell configured to allow the cooling medium to flow therein; a fixed portion used for fixing the shell to the outside and provided on a portion which does not allow the cooling medium to flow therein so as to protrude from a contour of the shell; an introduction portion having a shape projecting from the contour of the shell and being configured to introduce the cooling medium into the shell; a discharge portion having a shape projecting from the contour of the shell and being configured to discharge the cooling medium from the shell; and a low-rigidity portion which is a preferentially deformed portion provided on the shell in the vicinity of at least one of the introduction portion and the discharge portion separately from the fixed portion to lower the rigidity of the shell and configured to deform preferentially in comparison with other portions upon receipt of an external force.

In the cooler using the cooling medium according to the present invention, preferably, a notched section is provided between the low-rigidity portion and the fixed portion along a projecting shape of the introduction portion or the discharge portion.

In the cooler using the cooling medium according to the present invention, preferably, the low-rigidity portion is provided along the projecting shape of the introduction portion or the discharge portion and is a portion thinner than other portions.

Advantages of the Invention

According to one or more of the configurations described above, the cooler using the cooling medium includes the preferentially deformed portion formed in the vicinity of the at least one of the cooling medium introduction portion and the cooling medium discharge portion of the shell and configured to deform preferentially in comparison with the other portions upon receipt of an external force. Accordingly, leakage of the cooling medium from the cooler can be restrained upon receipt of the external force.

According to one or more of the configurations as described above, the low-rigidity portion is a preferentially deformed portion provided in the vicinity of at least one of the introduction portion and the discharge portion separately from the fixed portion to lower the rigidity of the shell and configured to deform preferentially in comparison with other portions upon receipt of the external force. For example, even when the external force is applied to the cooler and the force for deforming the shell acts from the introduction portion or the discharge portion projecting from the shell, the shell is deformed at the low-rigidity portion. Accordingly, leakage of the cooling medium from the cooler can be restrained.

REFERENCE NUMERALS

Figure 1:
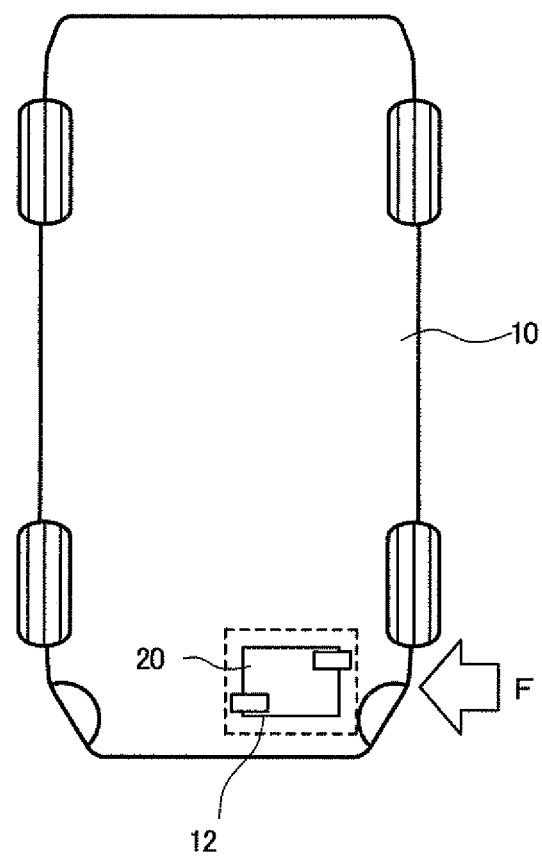
FIG. 1 is a plan view for explaining a state of arrangement of a cooler in an embodiment of the present invention mounted on a PCU in a hybrid vehicle.

10 vehicle, 12 PCU, 14 converter case, 16 bolt, 18 coolant, 20, 21 cooler, 22 bottom plate, 23, 25 protruded portion, 24, 26, 27, 29 fixed portion, 28 top plate, 30 shell, 32 inflow side pipe, 34 outflow side pipe, 36, 38 fixing hole, 40, 42 notched section

BEST MODES FOR CARRYING OUT THE INVENTION

Referring now to the drawings, an embodiment according to the present invention will be described in detail below. Although a cooler of a PCU in a hybrid vehicle having an engine and a dynamo-electric machine mounted thereon will be described below, the cooler of the present invention may be one other than the cooler for the PCU, so long as it is a cooler which may be broken upon receipt of an impact, and may be a cooler other than that mounted on the hybrid vehicle. As an impact applied to the cooler, a case of a side collision of the vehicle will be described. However, a case where the impact is applied from other directions is also applicable, depending on the arrangement of the cooler.

Figure 2:
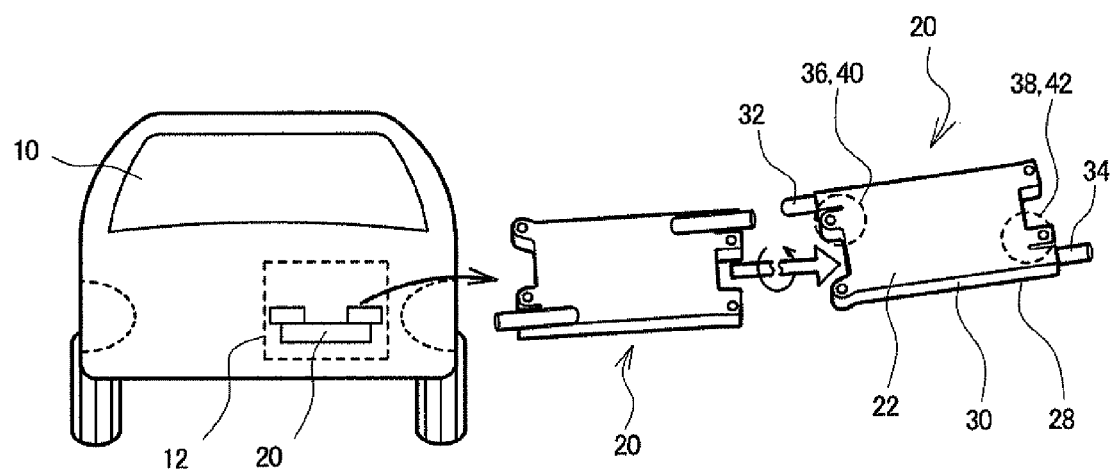
FIG. 2 is a front view corresponding to FIG.

FIG. 1 is a plan view for explaining a state of arrangement of a cooler 20 of a PCU 12 mounted on a vehicle 10. FIG. 2 is a front view corresponding to FIG. 1. The vehicle 10 is a hybrid vehicle having an engine and a dynamo-electric motor mounted thereon, not shown, and being capable of traveling using these members as drive sources. The PCU 12 to be connected to the dynamo-electric machine is provided and, for example, is arranged in an engine compartment in a front portion of the vehicle in which the engine and the dynamo-electric machine are to be mounted. As a position of arrangement of the PCU 12, there may be employed, for example, a battery tray where a low-voltage battery is arranged in a vehicle in which only a normal gasoline engine is mounted. In this case, the low-voltage battery may be rearranged to a different position; for example, to a rear portion of the vehicle.

The PCU 12 is a unitized member including circuit elements to be arranged so as to interconnect the power source such as a high-voltage accumulator battery and the dynamo-electric machine. The circuit elements of the PCU 12 may include a high-voltage voltage changer configured to perform a voltage change such as voltage boosting with respect to the high-voltage accumulator battery, an inverter circuit configured to switch the power between a direct-current power and an alternating-current power between the high-voltage voltage changer and the dynamo-electric machine, a low-voltage DC/DC converter which performs the voltage change such as voltage lowering or the like with respect to the low-voltage accumulation, and a dynamo-electric machine control circuit. Since heat is generated upon activation of the voltage changer, an IGBT (Insulated Gate Bipolar Transistor) serving as a switching element which constitutes the inverter circuit, a high-voltage diode, or the like, the cooler 20 for cooling these members is provided in the interior of the PCU 12.

Although the PCU 12 includes the respective circuit elements as described above and the cooler 20 being put together in a single unit case, the PCU 12 is divided into a converter subunit including the portion of the DC/DC converter as a unit, and an inverter subunit including the portion of the high-voltage voltage changer, the inverter circuit, and the dynamo-electric machine control circuit as a unit, and these subunits are put together to constitute a single unit. In this case, a member which stores the subunits is commonly used, and hence downsizing is achieved. For example, with a configuration of storing the converter subunit in the converter case, covering the same with the converter cover, then storing the inverter subunit on the opposite side from the converter case, and covering the same with the inverter cover, the converter case can be commonly used.

In this configuration, as the inverter subunit, the cooler 20 is fixed to the converter case, the heat-generating elements such as the IGBT, and the high-voltage diode are arranged in direct contact with the cooler 20, other circuit elements are arranged on a separate circuit board or the like, and these members are covered with the inverter cover.

In this manner, the cooler 20 is arranged in the interior of the PCU 12, and the heat-generating elements such as the IGBT, and the high-voltage diode are arranged on a heat-discharging surface thereof. Actually, several modules of the high-voltage voltage changer and the inverter circuit are provided, and the plurality of modules are arranged by being connected and fixed so as to be in direct contact with the heat-discharging surface of the cooler 20 so as to serve as the heat-generating modules.

In FIG. 1, an impactive force F is shown. The impactive force F is an impactive force applied to the vehicle body when the front portion of the vehicle 10 collides with a pole such as a street lamp from the side and, as is understood from FIG. 1, is an impactive force applied to the side surface of the cooler 20. The relationship between the impactive force F and the cooler 20 will be described again later.

FIG. 2 is a drawing illustrating a state in which the cooler 20 to be arranged in the PCU 12 shown in a front view of the vehicle 10 is extracted for showing the appearance of the cooler 20. A drawing extracted from the front view as indicated by an arrow is a perspective view of the cooler 20 as viewed from the upper surface side. Here, the expression "as viewed from an upper surface side" means "as viewed from a ceiling side of the vehicle 10," and has the same meaning as in the case of the plan view shown in FIG. 1. Then, the drawing inverted from the perspective view viewed from the upper surface side as indicated by a hollow arrow and a sign of rotation is a perspective view as viewed from a lower surface side after being rotated by 180 degrees to invert the upper surface side and the lower surface side. In other words, it means that the vehicle 10 is viewed from a ground surface side. This drawing corresponds to a bottom view if expressed in contrast to the plan view in FIG. 1.

As shown in FIG. 2, the cooler 20 includes a bottom plate 22, a top plate 28, and a shell 30 arranged therebetween. The cooler 20 is provided with an inflow side pipe 32 and an outflow side pipe 34 for allowing the cooling medium to flow therein, fixing holes 36, 38 for fixing the same at an adequate portion of the PCU 12, and a notched section 42 provided between a portion on which the fixing hole 38 is provided and the outflow side pipe 34 so as to lower the rigidity of the bottom plate 22. Also, a configuration in which a notched section 40 for lowering the rigidity of the bottom plate 22 is provided between the portion where the fixing hole 36 is provided and the inflow side pipe 32 is also applicable.

Figure 3:
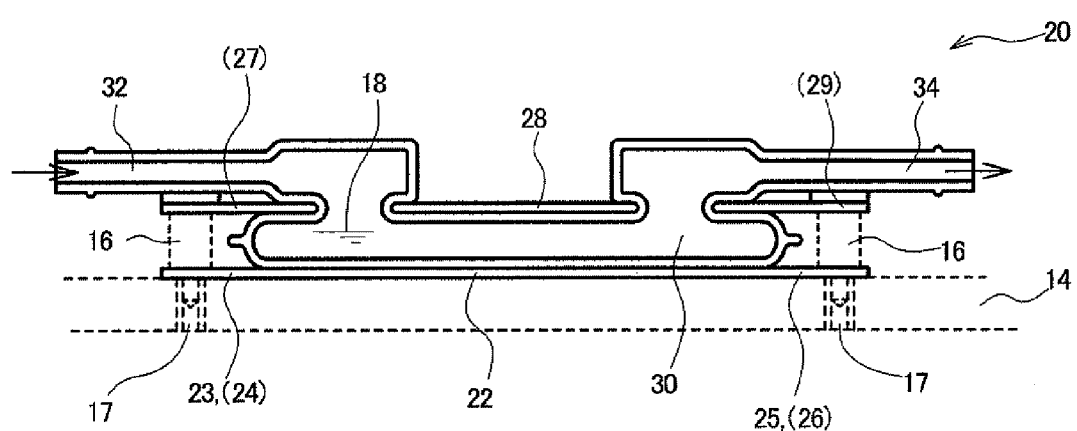
FIG. 3 is a cross-sectional view of the cooler in the embodiment of the present invention.
Figure 4:
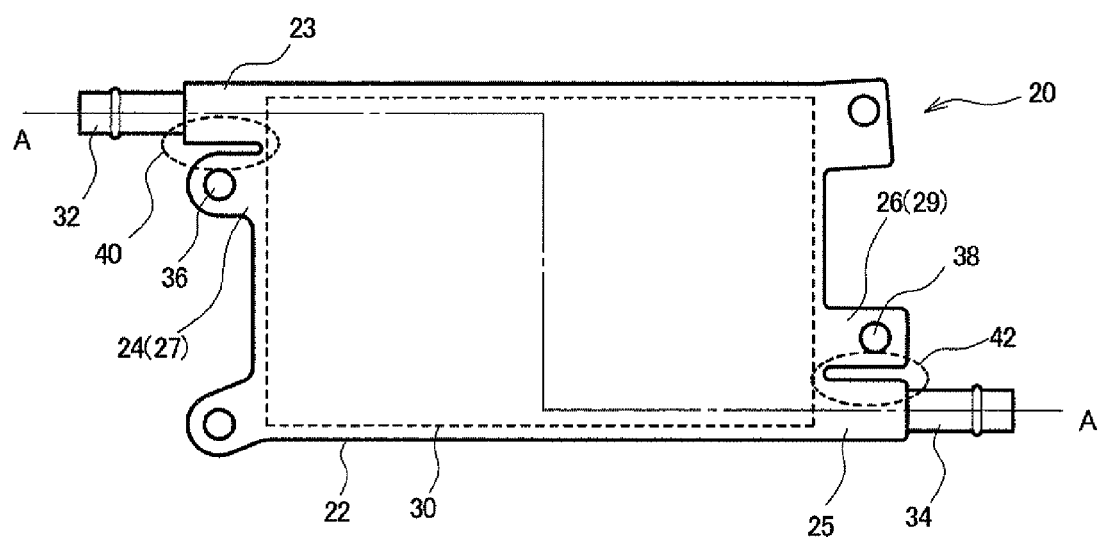
FIG. 4 is a bottom view corresponding to FIG. 3.

FIG. 3 and FIG. 4 show a detailed structure of the cooler 20. FIG. 3 is a cross-sectional view and FIG. 4 is a bottom view. The bottom view is a drawing as viewed from the lower surface corresponding to the perspective view as viewed from the lower surface in FIG. 2. FIG. 3 is a cross-sectional view taken along line A-A in FIG. 4. In the following description, reference numerals shown in FIG. 1 and FIG. 2 are used.

The shell 30 is a sealed container for circulating the cooling medium, and a cooling medium 18 flows in the interior thereof. The shell 30 is a flat container having a rectangular shape in plan view, and is provided with the inflow side pipe 32 serving as the introduction portion for introducing the cooling medium 18 in the interior thereof on one side thereof and the outflow side pipe 34 serving as the discharge portion for discharging the cooling medium 18 to the outside on the other side thereof. Therefore, the shell 30 is a container sealed from the outside except for an inflow side opening of the inflow side pipe 32 and an outflow side opening of the outflow side pipe 34, and allows the cooling medium 18 to flow therein.

As the shell 30 described above, there may be employed one formed by placing two members formed into a dish shape with a material having a high coefficient of thermal conductivity and opposing the same next to each other, and joining the same with the inflow side pipe 32 and the outflow side pipe 34, which are molded separately by drawing press or the like so as not to allow the leakage of fluid, respectively. A metallic material such as aluminum may be employed as the material, and an intermetallic connecting technique such as the brazing technique may be employed as a joining method.

The bottom plate 22 and the top plate 28 have a shape slightly larger than the shell 30 in plan view, and assume the form of flat plates to be connected and fixed respectively to the bottom surface and the upper surface of the shell 30 mechanically and so as to conduct heat. Also, each of the bottom plate 22 and the top plate 28 serves as a fixing plate for fixing the shell 30 to the outside, and as a module-arranging plate on which a heat-generating module is arranged. In FIG. 2 to FIG. 4, illustration of the heat-generating module arranged so as to be in contact with the cooler 20 is omitted.

In order to achieve the function as the fixing plate, the bottom plate 22 and the top plate 28 not only have a shape similar to and slightly larger than the shell 30 in plan view, but also have protruded portions protruding from a contour of the shell 30. The protruded portion means a state in which the bottom plate 22 or the top plate 28 exists at a portion where the contour of the shell 30 does not exist in plan view.

There are two types of the protruded portions, one of which includes portions protruding along the direction in which the inflow side pipe 32 and the outflow side pipe 34 are protruded for fixing these pipes. FIG. 4 shows a protruded portion 23 protruding along the direction in which the inflow side pipe 32 protrudes from the shell 30, and a protruded portion 25 protruding along the direction in which the outflow side pipe 34 protrudes from the shell 30.

The other type of the protruded portions includes portions protruding as fixed portions for fixing the shell 30 to the outside via the bottom plate 22 and the top plate 28. FIG. 4 shows the bottom plate 22 in a state in which the fixed portions for fixing holes are provided respectively at four corners of its substantially rectangular shape in plan view. These fixed portions are portions of the bottom plate 22 protruded further from the contour of the shell 30.

FIG. 4 specifically shows a state in which a fixed portion 24 for the fixing hole 36 is provided in the vicinity of the inflow side pipe 32, and a fixed portion 26 for the fixing hole 38 is provided in the vicinity of the outflow side pipe 34. The top plate 28 is also provided with fixed portions 27, 29 protruded further from the contour of the shell 30 corresponding to the fixed portions 24, 26, and fixing holes corresponding to the fixing holes 36, 38 of the bottom plate 22 are provided therethrough.

Since the fixed portions of the bottom plate 22 and the top plate 28 protrude further from the contour of the shell 30, the bottom plate 22 and the top plate 28 can be connected with each other via the fixing holes provided on the fixed portions. Bolts 16 shown in FIG. 3 are tightening members for mutually fixing the bottom plate 22 and the top plate 28 to a converter case 14 of the PCU 12 where the cooler 20 is arranged in the example shown above. Accordingly, the cooler 20 is fixed firmly to the converter case 14. The converter case 14 is designed so as to have sufficient rigidity to serve as a foundation for fixation.

In FIG. 4, the protruded portion 25 of the portion of the outflow side pipe 34 and the fixed portion 26 in the vicinity thereof can be formed as an integral protruded portion under normal conditions. However, the notched section 42 is provided therebetween. The notched section 42 is provided along the protruding shape of the outflow side pipe 34. The notched section 42 is a portion of the bottom plate 22 where the rigidity is lowered for allowing easy deformation of the protruded portion 25 with respect to the fixed portion 26 when the outflow side pipe 34 receives the impactive force from the outside in the axial direction.

In this manner, the structure of the bottom plate 22 in which the rigidity is lowered to allow easy deformation of the protruded portion 25 when the outflow side pipe 34 receives the impactive force from the outside in the axial direction may be a structure in which the thickness of the portion of the protruded portion 25 is reduced with respect to other portions instead of the notched section 42.

Figure 5:
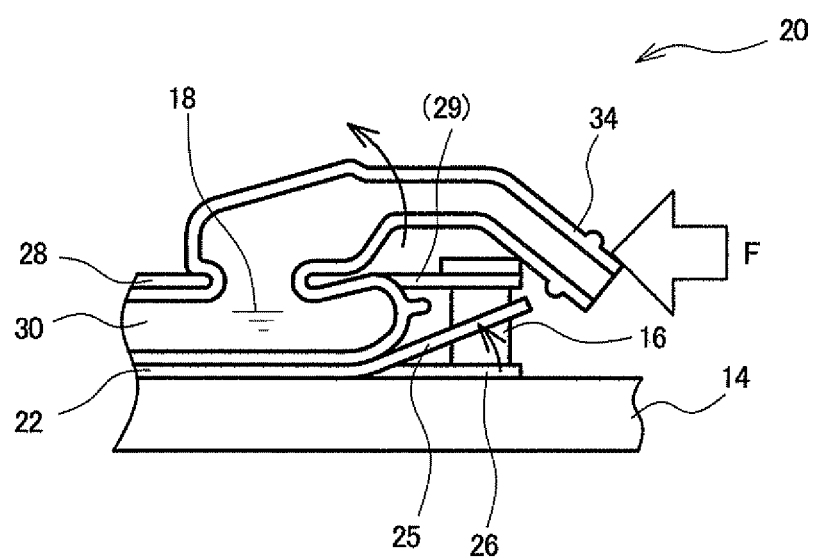
FIG. 5 is a view showing a state in which an impactive force F is applied to the cooler in the embodiment of the present invention.
Figure 6:
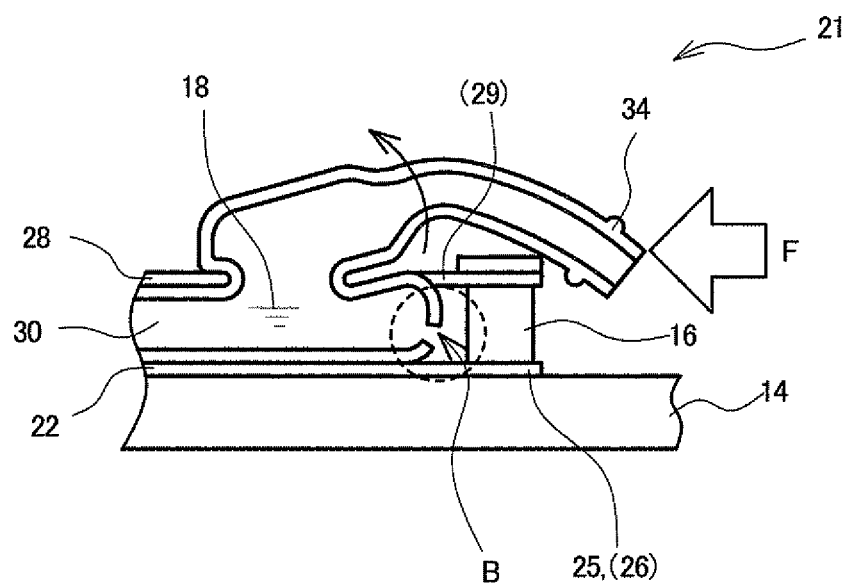
FIG. 6 is a drawing showing a state in which the impactive force F is applied to the cooler having a structure in the related art.

The action of the configuration as described above will be described with reference to FIG. 5 and FIG. 6. In the following description, the same components as those in FIG. 1 to FIG. 4 are designated by the same reference numerals, and repeated description thereof is omitted. In the following description, reference numerals shown in FIG. 1 to FIG. 4 are used. FIG. 5 shows a structure of a right half of the cooler 20 described in conjunction with FIG. 3 and FIG. 4, and shows a state in which the impactive force F is applied to the outflow side pipe 34. FIG. 6 shows a cooler 21 having a structure in which the notched section 40 serving as the portion for lowering the rigidity is not provided on the bottom plate 22 and the like as the structure in the related art, and shows a state in which the impactive force F is applied to the outflow side pipe 34 as in FIG. 5. The impactive force F is an impactive force applied to the vehicle body by the side collision of the front portion of the vehicle 10 as described in conjunction with FIG. 1. However, since it is equivalent to the impactive force applied to the outflow side pipe 34 in the axial direction in terms of the cooler 20, it is explained as the same impactive force F as that in FIG. 1.

In FIG. 5, when the impactive force F is applied to the cooler 20, the outflow side pipe 34 is pushed inward and, in this case, is deformed so as to raise an end portion of the shell 30. In FIG. 5, the direction in which the outflow side pipe 34 and the shell 30 are raised and deformed is shown by an arrow. At this time, the fixed portion 26 is firmly fixed to the converter case 14 via the bolt 16, and hence is not raised. In contrast, since the notched section 42 which lowers the rigidity of the bottom plate 22 is provided between the fixed portion 26 and the protruded portion 25, if the end portion of the shell 30 is raised, the protruded portion 25 fixed to the outflow side pipe 34 with the brazing technique or the like can also be raised. Therefore, even when the impactive force F is applied to the outflow side pipe 34, and a deforming force which raises the shell 30 is applied correspondingly, the shell 30 can be deformed relatively freely irrespective of a fixing force by the fixed portion 26 by the action of the notched section 42, so that breakage of the shell 30 can be restrained without application of an excessive force to the material of the shell 30.

In FIG. 6, which is shown for comparison, there is shown the cooler 21 having the structure in the related art; that is, the structure in which the notched section 40 serving as the portion for lowering the rigidity is not provided on the bottom plate 22. In the cooler 21, since the notched section 40 is not provided, the protruded portion 25 and the fixed portion 26 described in conjunction with FIG. 4 are continuously integrated. In the fixed portion 26, the converter case 14, and the bottom plate 22 and the top plate 28 are firmly fixed with the bolt 16. Therefore, the protruded portion 25 fixed to the outflow side pipe 34, for example, with a brazing technique or the like is also firmly fixed to the converter case 14 or the like.

When the impactive force F is applied to the cooler 21 in this state, the outflow side pipe 34 is pushed inward and, at this time, is deformed so as to raise the end portion of the shell 30. In FIG. 6 as well, the direction of deformation of the outflow side pipe 34 is indicated by an arrow. At this time, although the deforming force to raise the shell 30 is also applied thereto, a lower side of the shell 30 is firmly fixed to the protruded portion 25 with the brazing technique or the like, and the protruded portion 25 is firmly fixed to the converter case 14 with the bolt 16 as described above. Therefore, the lower side of the shell 30; that is, the bottom plate 22, is fixed to the converter case 14 and hence can be deformed little. In contrast, the upper side of the shell 30; that is, the top plate 28, receives the deforming force so as to be raised in association with the deformation of the outflow side pipe 34. Consequently, a large stress is applied to the end portion of the shell 30, and the shell 30 may be broken as shown in a portion B in FIG. 6. When the shell 30 is broken and a hole is formed with respect to the outside, the cooling medium 18 flows out therethrough to the outside, and enters the interior of the PCU 12, and hence may come into contact with a high-voltage operating element such as the IGBT.

In contrast, as described in conjunction with FIG. 5, with the structure of the bottom plate 22 in which the portion having low rigidity is provided and the protruded portion 25 on which the outflow side pipe 34 is fixed is easily deformable, the breakage of the shell 30 can be restrained even when the impactive force F is applied to the cooler 20.

As the structure in which the shell 30 is prevented from being broken when the impactive force is applied to the cooler 20 from the outside, the rigidity of other adequate portions of the bottom plate 22 and the top plate 28 may be lowered if needed. In FIG. 4, there is shown an example in which the notched section 40 is provided also in the vicinity of the inflow side pipe 32. The top plate 28 may be provided with a similar notched section. As a matter of course, a portion which is thinner may be provided instead of the notched section.

INDUSTRIAL APPLICABILITY

The cooler 20 is suitable as the cooler installed at a position which may be subjected to an impact; for example, as the cooler for a power control unit for a hybrid vehicle.

The invention claimed is:

1. A cooler using a cooling medium, the cooler comprising:
    a shell which is a flat, sealed container and configured to allow the cooling medium to flow therein;
    an inflow side pipe which is formed to project from the shell and is configured to introduce the cooling medium into the shell;
    an outflow side pipe which is formed to project from the shell and is configured to discharge the cooling medium from the shell; and
    a bottom plate which is fixed on a bottom surface of the shell, wherein
    the bottom plate comprises:
    a plurality of protruded portions, a part of which protrudes from the shell along a direction of projection of the inflow side pipe and the outflow side pipe, and each of which is fixed on each pipe; and
    a plurality of fixed portions used for fixing the shell to a structure to be cooled and in which a portion adjacent to each protruded portion protrudes from the shell and a through hole to which a fastening member is inserted is formed in the protruded portion, and wherein
    a notched portion which is formed between the fixed portion and the protruded portion by being cut along a direction of projection of each pipe and which allows deformation of the protruded portion upon reception of an impactive force along an axial direction of each pipe is formed on the bottom plate.

2. The cooler using a cooling medium according to claim 1, further comprising:
    a top plate fixed on an upper surface of the shell, wherein
    at the fixed portion, the top plate and the bottom plate protrude from the shell, and
    a through hole to which a fastening member is inserted is formed in the protruded portion.

* * * * *